(12) United States Patent
Lee et al.

(10) Patent No.: US 7,732,851 B2
(45) Date of Patent: Jun. 8, 2010

(54) METHOD FOR FABRICATING A THREE-DIMENSIONAL CAPACITOR

(75) Inventors: Jung-hyun Lee, Yongin-si (KR); Sung-ho Park, Seongnam-si (KR); Sang-jun Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 352 days.

(21) Appl. No.: 11/207,711

(22) Filed: Aug. 22, 2005

(65) Prior Publication Data

US 2006/0040444 A1 Feb. 23, 2006

(30) Foreign Application Priority Data

Aug. 20, 2004 (KR) ...................... 10-2004-0065876

(51) Int. Cl.
H01L 27/108 (2006.01)
(52) U.S. Cl. ........................ 257/310; 257/312; 257/528; 257/532; 257/E21.01; 257/E27.048; 438/238; 438/239; 438/240; 438/393; 438/396
(58) Field of Classification Search ................. 257/310, 257/E21.01, 312, 328, 532, E27.048; 438/240, 438/238, 239, 393, 396
See application file for complete search history.

(56) References Cited

U.S. PATENT DOCUMENTS

| | | | |
|---|---|---|---|
| 6,194,281 B1 | 2/2001 | Kang et al. | |
| 6,337,216 B1 | 1/2002 | Koo | |
| 6,576,928 B2 * | 6/2003 | Hiratani et al. | ................ 257/68 |
| 6,605,838 B1 | 8/2003 | Mandelman et al. | |
| 2002/0074584 A1 | 6/2002 | Yang | |
| 2002/0090779 A1 | 7/2002 | Jang | |
| 2003/0151083 A1 * | 8/2003 | Matsui et al. | ................ 257/310 |
| 2004/0065938 A1 | 4/2004 | Won et al. | |
| 2005/0042836 A1 | 2/2005 | Lee et al. | |

FOREIGN PATENT DOCUMENTS

KR 20020010982 2/2002

OTHER PUBLICATIONS

Gurtej S. Sandhu et al., "Integration of High Aspect Ratio Structures", Electrochemical Society, 2005, p. 395.
Chinese Office Action dated Mar. 21, 2008 (with English translation).
Kukli et al., "Development of Dielectric Properties of Niobium Oxide, Tantalum Oxide, and Aluminum Oxide Based Nanolayered Materials," Journal of the Electrochemical Society, Jan. 1, 2001, pp. F35-41, vol. 148, No. 2, Electrochemical Society, Manchester, New Hampshire, U.S.
European Search Report from corresponding European Application No. 05255060 mailed on Jul. 15, 2008.

* cited by examiner

Primary Examiner—Matthew E Warren
Assistant Examiner—John Lin
(74) Attorney, Agent, or Firm—Harness, Dickey & Pierce, P.L.C.

(57) ABSTRACT

A capacitor and a method of fabricating the capacitor are provided herein. The capacitor can be formed by forming two or more dielectric layers and a lower electrode, wherein at least one of the two or more dielectric layers is formed before the lower electrode is formed.

20 Claims, 7 Drawing Sheets

METHOD FOR FABRICATING A THREE-DIMENSIONAL CAPACITOR

This application claims priority under 35 U.S.C. 119 to Korean Patent Application No. 10-2004-0065876, which was filed on Aug. 20, 2004 in the Korean Intellectual Property Office, the disclosure of which is incorporated herein in its entirety by reference.

BACKGROUND

1. Field of the Invention

The present invention relates to three-dimensional capacitors. More particularly, the invention relates to a three-dimensional capacitor, in which a bi-layer dielectric layer is used between the electrodes.

2. Background Information

Small cell size is crucial to allow minimal chip size and thus reduce chip cost. While the integrated circuit (IC) dimensions continue to shrink down to the nanometer arena, the vertical dimensions of these nano-scale device structures do not scale due to many constraints. For example, device-scaling performance requirements limit the vertical scaling. Moreover, process integration considerations etch selectivity during dry etch, polish stop margin for chemical mechanical planarization (CMP), and defect considerations limit the thickness of films and material stacks during the fabrication of IC chips.

Traditionally, a storage charge in a cell has been increased by decreasing the dielectric thickness and/or by increasing the capacitor area. The area of the capacitors has been increased through the use of complex three-dimensional capacitor structures, such as deep cylinders, studs, and crowns. Three-dimensional capacitor structures utilize high aspect ratios in order to increase the capacitor area; however, the structures required to demonstrate this capacitance at pitches that are commensurate with future technology shrinks are becoming increasingly difficult to fabricate. Therefore, these high-aspect capacitors pose a variety of new challenges related to patterning, deposition, and etch processes, as well as mechanical stability during and after fabrication.

In order to provide the increased capacitance desired, high-dielectric materials, such as tantalum oxide (TaO) and strontium titanium oxide ($SrTiO_3$), are often used as they tend to have a larger permittivity than low-dielectric materials such as $SiO_2$ and $Si_3N_4$, which can also be used. However, despite the availability and use of these high-dielectric materials, a three-dimensional capacitor is still required to realize a capacitor having a large capacitance. Additionally, in three-dimensional capacitors, ruthenium (Ru) has been used for electrodes, wherein the Ru can be deposited into a patterned $SiO_2$ hole to form a Ru electrode. However, the low solubility of Ru into $SiO_2$ can be problematic for depositing a Ru electrode in a patterned $SiO_2$ hole.

However, one problem with providing a three-dimensional capacitor with a Ru electrode is that high process temperatures can lead to difficulties in applying a dielectric layer to a Ru electrode. For example, if a dielectric layer of $Ta_2O_5$ were to be used with a Ru electrode, the process temperature of the Ru based capacitor should be kept below 700° C. to prevent failure of the capacitor. Temperatures above the upper limit of 700° C. could cause a high temperature anneal of the $Ta_2O_5$ and can cause a Ru electrode of the Ru-based capacitor to suffer from contact resistance failure at this temperature (higher than 700° C.). Thus, a Ru-based capacitor with a $Ta_2O_5$ dielectric layer is desirably processed at temperatures less than 700° C., which is less than desired for manufacturing purposes.

SUMMARY

To solve the above-described problems, an exemplary embodiment provides a three-dimensional capacitor, in which two or more dielectric layers are provided including a first layer of a Group V metal oxide layer between electrodes of the capacitor.

Accordingly, in another exemplary embodiment, there is provided a method of fabricating a capacitor, the method comprising: forming two or more dielectric layers and a lower electrode, wherein at least one of the two or more dielectric layers is formed before the lower electrode is formed, and wherein the at least one of the two or more dielectric layers formed before the lower electrode is formed comprises a buffer layer comprising a Group V metal oxide; and forming an upper electrode of a platinum group metal on the two or more dielectric layers.

In another exemplary embodiment, provided is a three-dimensional capacitor, comprising: an inner electrode; a Group V metal oxide buffer layer on the inner electrode, wherein an upper portion of the buffer layer is thinner than a lower portion of the buffer layer; a dielectric layer of tantalum oxide disposed on the buffer layer, wherein an upper portion of the dielectric layer is thicker than a lower portion of the dielectric layer; and an outer electrode disposed on the dielectric layer.

BRIEF DESCRIPTION OF THE DRAWINGS

The above features and advantages will become more apparent by describing in detail a preferred embodiment thereof with reference to the attached drawings in which.

DETAILED DESCRIPTION

Korean Patent Application No. 2002-10982, entitled "Capacitor For Semiconductor Device, Manufacturing Method Thereof, And Electronic Device," filed on Feb. 28, 2002, and U.S. patent application Ser. No. 10/930,953, filed on Sep. 1, 2004, now U.S. Pat. No. 7,105,401, are incorporated by reference herein in their entirety.

As mentioned above, high aspect ratios are desired for three-dimensional capacitors; however, structures with high aspect ratios are becoming increasingly difficult to fabricate with the size limitation presently applied to the three-dimensional capacitors. Additionally, in using Ru for electrodes in patterned insulating layers, such as $SiO_2$ holes, the low solubility of Ru into $SiO_2$ can be problematic for depositing a Ru electrode in a patterned $SiO_2$ insulating layer hole. Thus, in an exemplary embodiment, a bi-layer dielectric layer is provided within a high aspect ratio patterned $SiO_2$ insulating layer hole to aid in the fabrication of a high aspect ratio three-dimensional capacitor. Also, by using a bi-layer dielectric, problems that may be associated with the solubility of Ru into $SiO_2$ and a high temperature annealing process can be minimized, while the nucleation density of electrodes therein can be improved.

Figure 1:
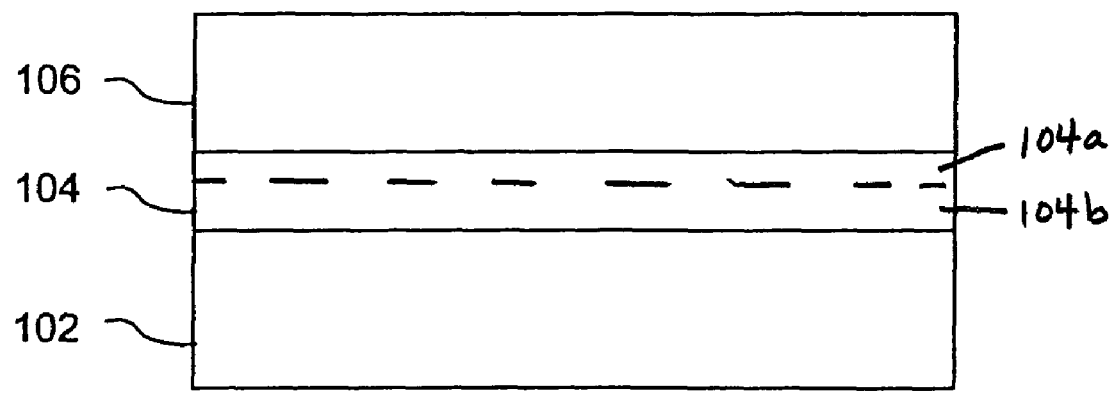
FIG. 1 is a schematic illustration of an exemplary three-dimensional capacitor.

In one embodiment, a capacitor 100 is provided to illustrate how a high aspect ratio $SiO_2$ insulating layer hole can be filled with a first electrode 102, as illustrated in FIG. 1. The capacitor 100 comprises a first electrode 102, such as platinum metal group electrode, for example Ru, (lower electrode in the orientation shown), a bi-layer dielectric layer 104 disposed on the first electrode 102 and a second electrode (upper electrode in the orientation shown) 106 disposed on the bi-layer dielectric layer 104. By providing the bi-layer dielectric layer 104, it is believed that the formation of the Ru first electrode 102 can be formed within the high aspect ratio $SiO_2$ hole while solving the problems listed above.

Figure 2:
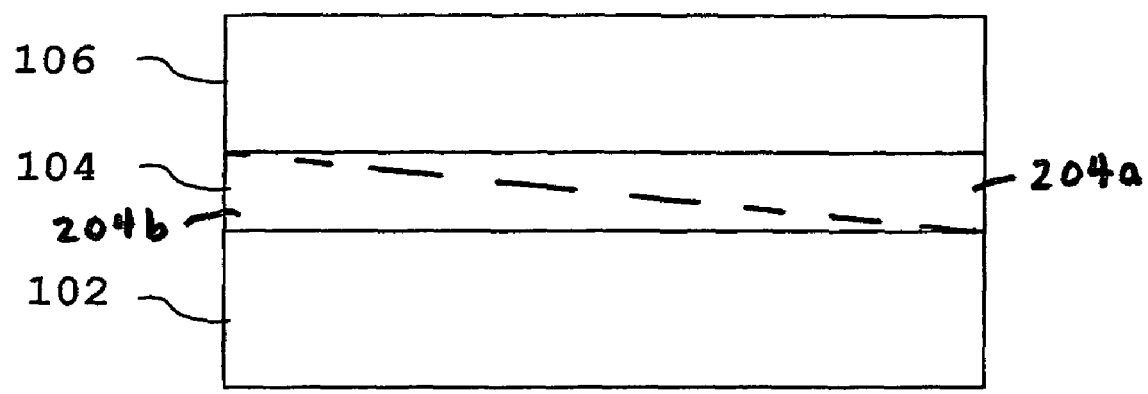
FIG. 2 is a schematic illustration of an exemplary three-dimensional capacitor.

The bi-layer dielectric layer 104 is preferably a two layer dielectric layer with a first layer 104a (or 204a as illustrated in FIG. 2) that can be a ferroelectric material, a non-ferroelectric, high capacity material, or a low-dielectric material, and a second layer 104b (or 204b as illustrated in FIG. 2) that can be a Group V metal oxide buffer layer. It is noted that the first and second layers 104a, 104b, can be in any conformation providing the attributes listed herein. For example, the layers can each be formed in a rectilinear shape, as illustrated in FIG. 1, or the layers can each be formed in a triangular shape, as illustrated in FIG. 2. Additionally, the layers can be of any thickness and do not require planarization if not desired.

By combining the two layers including a Group V metal oxide buffer layer, it is believed that the first layer 104a of the bi-layer 104 in the $SiO_2$ hole can provide improved capacitance properties, while the second layer 104b of the bi-layer 104 can provide improved deposition properties for the first layer 104a in the $SiO_2$ hole.

Examples of ferroelectric materials that can be used as the first layer include, but are not limited to materials such as lead-zirconate-titanate (PZT) also referred to as $PbZrTiO_3$ (though not necessarily limited to that composition), strontium-bismuth-tantalate (SBT) also referred to as $SrBiTa_2O_9$ (though not necessarily at that composition), bismuth-lanthanum-titanate (BLT) also referred to as $(BiLa)_4Ti_3O_{12}$ (though not necessarily at that composition), or barium-strontium-titanate (BST) also referred to as $BaSrTiO_3$ (though not necessarily at that composition). Examples of non-ferromagnetic materials that can be used as the first layer include, but are not limited to dielectric materials such as tantalum oxide (TaO) or strontium titanium oxide ($SrTiO_3$), as well as $SiO_2$ and $Si_3N_4$.

In exemplary embodiments, the second dielectric layers or buffer layers include Group V metal oxides. Preferably, the Group V metal oxides include, but are not limited to, at least one selected from the group consisting of vanadium oxides (i.e., VO, $VO_2$, $V_2O_3$, $V_2O_5$, or $V_3O_5$, most preferably $V_2O_5$), niobium oxides (i.e., NbO, $NbO_2$, or $Nb_2O_5$, most preferably $Nb_2O_5$), or tantalum oxides (i.e., TaO, $TaO_2$, or $Ta_2O_5$). It is noted that vanadium oxides and niobium oxides are desired for their lower crystallization temperatures. For example, $V_2O_5$ can crystallize at about 300° C., while $Nb_2O_5$ can crystallize at about 400° C. Therefore, a bi-layer of dielectric layers comprising a Group V metal oxide and $Ta_2O_5$, such as $Nb_2O_5/Ta_2O_5$ can be used, wherein the bi-layer can then be crystallized at about 550° C. rather than around 700° C. as used for $Ta_2O_5$ alone.

The bi-layer dielectric layer 104 can be prepared using any suitable technique such as sputtering, CVD (including metal organic CVD), with or without a post-anneal treatment in an oxygen atmosphere, or by another suitable technique including but not limited to those conventionally known to those of ordinary skill in the art. Thus, the bi-layer dielectric layer 104 can have surfaces parallel to the electrodes 102, 106, as illustrated in FIG. 1, or can have surfaces askew to the electrodes 102, 106, as illustrated in FIG. 2 (and illustrated in FIGS. 4B-4G).

The upper electrode 106 can be any suitable electrically conducting material such as, for example, Al, Ir, $IrO_2$, combination of Ir and $IrO_2$, Ru, $RuO_2$, combination of Ru and $RuO_2$, Pt, or an alloy, and can be formed by any suitable techniques such as sputtering or CVD, for example. Any suitable thicknesses, shapes and/or lateral dimensions for the lower electrode 102, the bi-layer dielectric layer 104 and the upper electrode 106 can be used, the choices of which can be made by one of ordinary skill in the art depending upon the desired use of the capacitor 100.

Figure 3A:
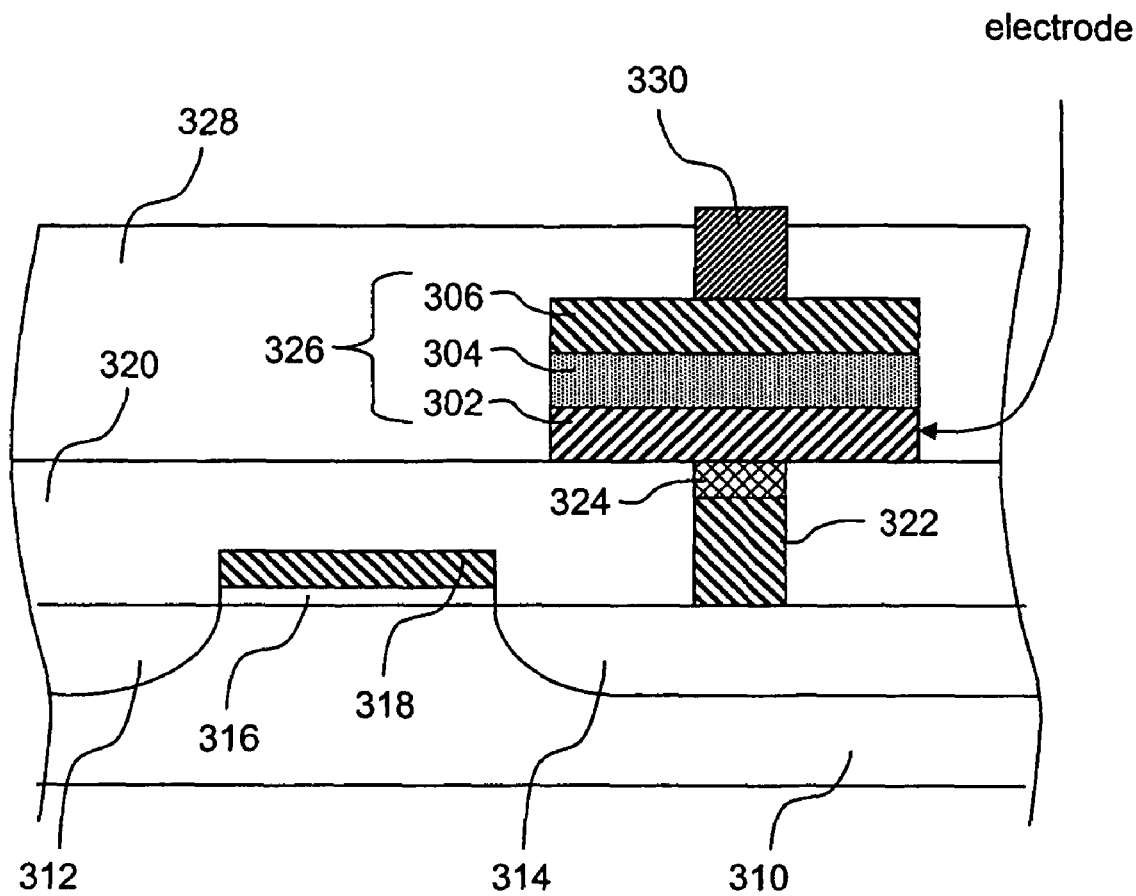
FIGS. 3A and 3B illustrates a cross-sectional view showing an embodiment of a memory device employing an exemplary three-dimensional capacitor.

In one embodiment, such a capacitor may be applied to various electronic devices such as a dynamic RAM (DRAM) device and non-volatile memory (FRAM), which as illustrated in FIG. 3A, can include a memory device of a single transistor type.

In another embodiment, a memory comprising a substrate and a plurality of memory cells arranged on the substrate is provided, each memory cell including a first electrode, a dielectric layer disposed on the first electrode, and a second electrode disposed on the dielectric layer. FIG. 3A illustrates a portion of an exemplary memory 300 in cross-sectional view for which an exemplary memory cell is shown. The memory cell 300 is arranged on a substrate 310 and comprises a transistor structure and a capacitor structure. In particular, the transistor structure comprises a drain region 312 and a source region 314 arranged in the substrate 310 (e.g., a semiconductor substrate such as silicon), as well as a gate oxide 316 (e.g., $SiO_2$, $Ta_2O_5$, or other suitable insulator) and a gate electrode 318 (e.g., Al, Pt, W, or other suitable conducting material) disposed above and between the drain and source regions 312 and 314. A first insulating layer 320 (e.g., $SiO_2$ or other insulating material) surrounds the gate oxide 316 and the gate electrode 318.

The memory cell 300 also includes a capacitor 326, such as that illustrated in FIG. 1, comprising a first electrode 302 (lower electrode), which can be made of a platinum group metal, such as Ru, a bi-layer dielectric layer 304 disposed on the first electrode 302, and a second electrode 306 (upper electrode) disposed on the dielectric layer 304. The bi-layer dielectric layer 304 and the upper electrode 306 can be formed of similar materials with similar shapes and sizes as those described for the capacitor 100 of FIGS. 1 and 2, for example. For example, the lower electrode 302 can be formed of Ru, while the bi-layer dielectric layer 304 can be formed from a ferroelectric or non-ferroelectric first layer and a Group V metal oxide second layer.

In addition, the memory cell 300 can also include other portions as illustrated in FIG. 3. A contact plug 322 (made of, e.g., W, Ru, Ru/$RuO_2$, TiN, polysilicon or any suitable conductor) can be provided to make electrical contact between the lower electrode 302 and the source region 314. A plate line 330 (e.g., Al, Pt, or other suitable conductive material) can be provided to make electrical contact to the upper electrode 306. A second barrier layer 324 (made of, e.g, TiN, TiSiN, TiAlN) can also be provided, if desired, between the contact plug 322 and the lower electrode 302. A second insulating layer 328 (e.g., $SiO_2$ or other insulating material) can be provided to surround the capacitor 326 as illustrated. A word line (not shown) can be connected to the gate electrode 318, and a bit line (not shown) can be connected to the drain 312, as known to those of ordinary skill in the art. Any suitable thicknesses, lateral dimensions, and overall shapes for the lower electrode 302, the bi-layer dielectric layer 304 and the upper electrode 306 can be used, wherein the choices can be made by one of ordinary skill in the art depending upon the desired performance specifications of the memory 300.

The memory 300 can be fabricated using conventional techniques known to those of ordinary skill in the art, such as disclosed, for example, in U.S. Pat. Nos. 6,337,216 and 6,605, 835, each of which are incorporated herein by reference. For example, an insulating layer used to make the gate oxide 316 and a metallization layer used to the gate electrode can be deposited on the substrate 310 using any suitable deposition technique(s). Lithographic patterning and etching can then be carried out to define the gate electrodes 318 and the gate oxides 216. Ion-implantation can then be carried out using the gate electrodes 318 as a self-aligned mask, for instance, to form the source and drain regions 314 and 312 (with suitable masking to protect other areas from being implanted). Patterning and metallization can then be carried out to form word lines and bit lines connected to the gate electrodes 318 and source regions 314, respectively. An insulating material can then be deposited on the structure to form the first insulating layer 320, which can be processed by chemical-mechanical planarization (CMP) to provide a smooth surface.

Openings for the contact plugs 322 can then be formed in the insulating layer 320 by lithographic patterning and etching, and appropriate materials, such as those noted above, can be deposited by any suitable technique (e.g., sputtering, evaporation, CVD) to form the contact plugs 322 and the second barrier layers 324. The insulating layer 320 with the plug and barrier materials deposited thereon can be further processed by CMP to produce a smooth surface. The dielectric capacitors 326 can then be formed on the surface of the insulating layer 320 (above the contact plugs 322) by techniques noted above. A second insulating layer 328 can then be deposited by any suitable technique (e.g., sputtering, CVD) to surround the dielectric capacitors 326. The surface of the second insulating layer 320 can then be processed by CMP, and the resulting surface can be patterned and etched to provide openings for the plate lines 330 to contact the upper electrodes 306. The plate lines 330 can be deposited by any suitable technique (e.g., sputtering, evaporation, CVD) to fill the openings for the plate lines 330.

Figure 3B:
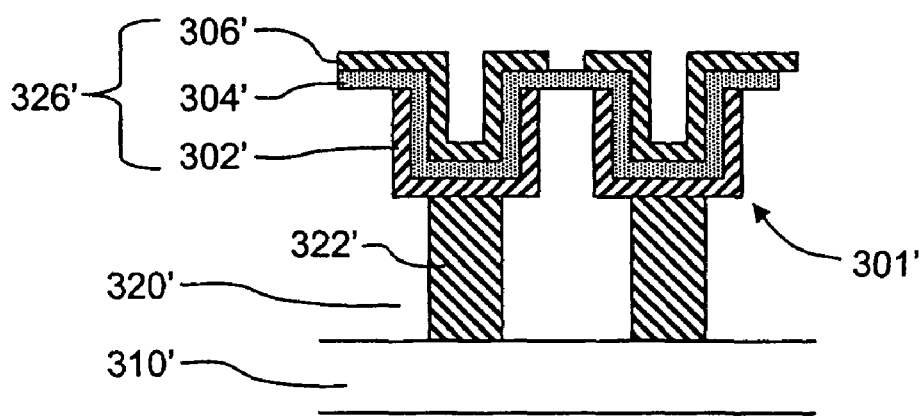

FIG. 3B illustrates an alternative to the capacitor 326 of the memory cell shown in FIG. 3A. The three-dimensional capacitor 326' shown in FIG. 3B includes a first electrode 302' (lower electrode) comprising Ru, a bi-layer dielectric layer 304' deposited on the first electrode 302' and a second electrode 306' (upper electrode) deposited on the bi-layer dielectric layer 304'. In contrast to the embodiment of FIG. 3A, however, the first and second electrodes 302', 306' and the dielectric layer 304' are formed on at least two side walls and the bottom of a trench 301'. By forming the electrodes 302', 306' and dielectric layer 304' in such a manner, a greater capacitance area can be created without enlarging the surface area occupied by the capacitor. The composition of the capacitor can be the same as depicted and described with reference to FIG. 3A and can include a contact plug 322' in a first insulating layer 320' that is positioned on a substrate 310'. Naturally, the transistor shown in FIG. 3A can be used in conjunction with its capacitor structure 326', or alternative circuit elements can be connected thereto.

It should be understood that the capacitors illustrated in FIGS. 3A and 3B and the resulting memory structure are intended to be illustrative and not restrictive. Capacitors having a bi-layer dielectric layer as disclosed herein can be employed in any type of DRAM or FRAM configuration that utilizes capacitors, including both destructive read out (DRO) devices and non-destructive read out (NDRO) devices. For example, capacitors as disclosed herein can be employed in conventional RAM configurations in which a capacitor is positioned at the gate of a transistor, the lower electrode being disposed on the gate oxide.

Additionally, an exemplary method of fabricating a capacitor for use in a semiconductor device is provided, wherein although not illustrated per se, the method forms capacitors similar to those illustrated in FIGS. 1 and 2. First, a lower electrode is formed of a platinum group metal. The platinum group metal is at least one element selected from the group consisting of ruthenium (Ru), rhodium (Rh), palladium (Pd), osmium (Os), iridium (Ir), and platinum (Pt). Then, a bi-layer dielectric layer comprising a buffer layer and a dielectric layer is formed on the lower electrode, wherein initially the buffer layer can be formed on the lower electrode. Thereafter, a dielectric layer can be formed on the buffer layer, wherein the buffer layer is formed of a Group V metal oxide, preferably a vanadium oxide, a niobium oxide, or a combination thereof. Then, the capacitor is completed by forming an upper electrode on the dielectric layer using a platinum group metal.

Alternatively, a three-dimensional capacitor with a bi-layer dielectric can be formed by forming a lower electrode, which can be made of a platinum group metal, such as Ru, on a buffer layer, which can be made of a Group V metal oxide, such as $Nb_2O_5$ or $V_2O_5$. An exemplary method is illustrated in FIGS. 4A-4F.

Figure 4A:
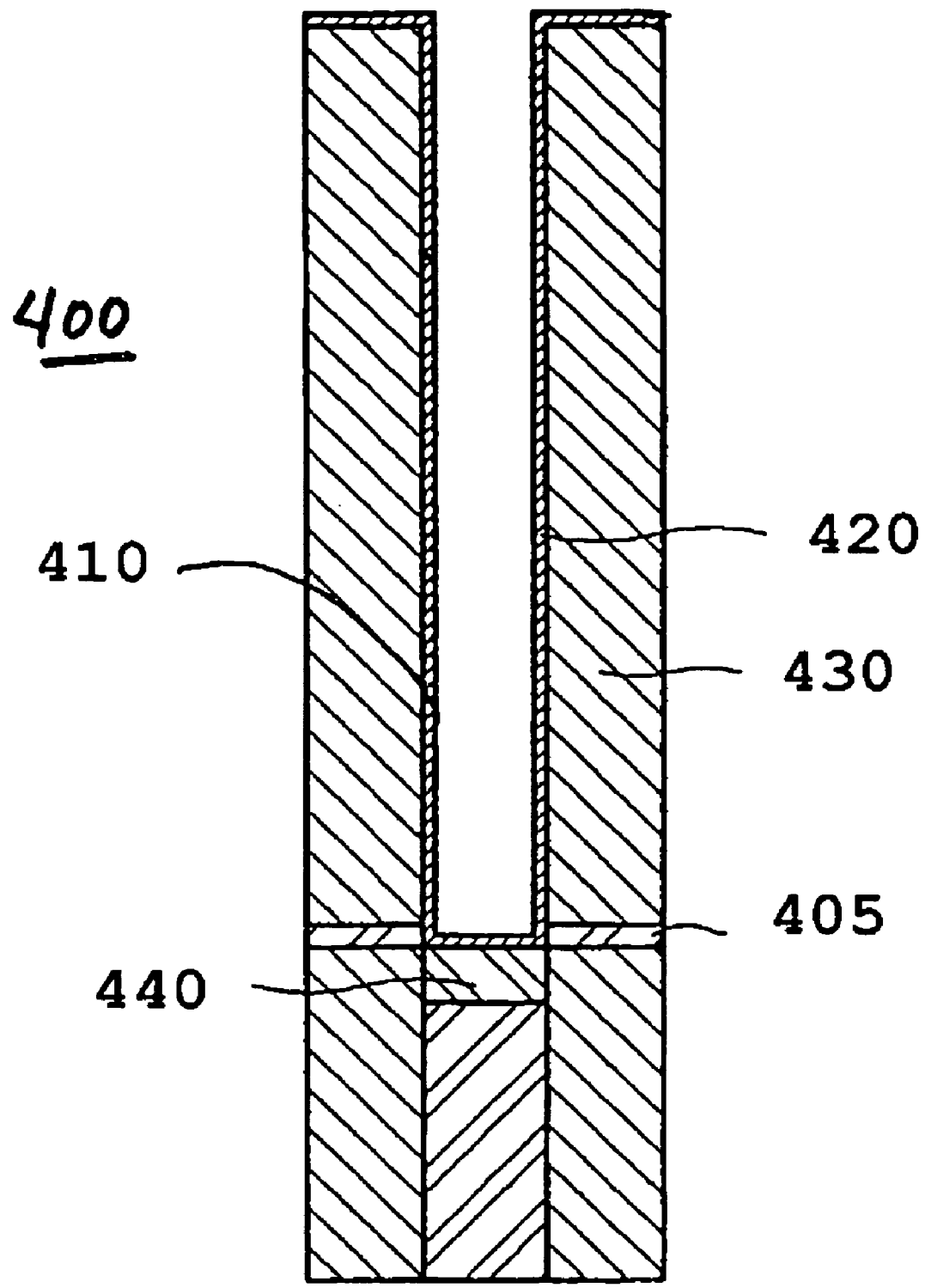
FIGS. 4A-4G illustrate a cross-section showing an embodiment of a method of fabricating an exemplary three-dimensional capacitor.

As illustrated in FIG. 4A, a trench 410 can be formed in an insulating material 430, such as $SiO_2$, wherein a Group V metal oxide buffer layer 420, such as $Nb_2O_5$ or $V_2O_5$, can be deposited within a trench 410. Additionally, a barrier 440 of TiN, TiAlN, or TaN, for example, can be formed at the base of the trench 410. Also as illustrated in FIG. 4A, the capacitor 400 can include a TiN layer 405 that forms a portion of the sidewalls of the trench 410.

Figure 4B:
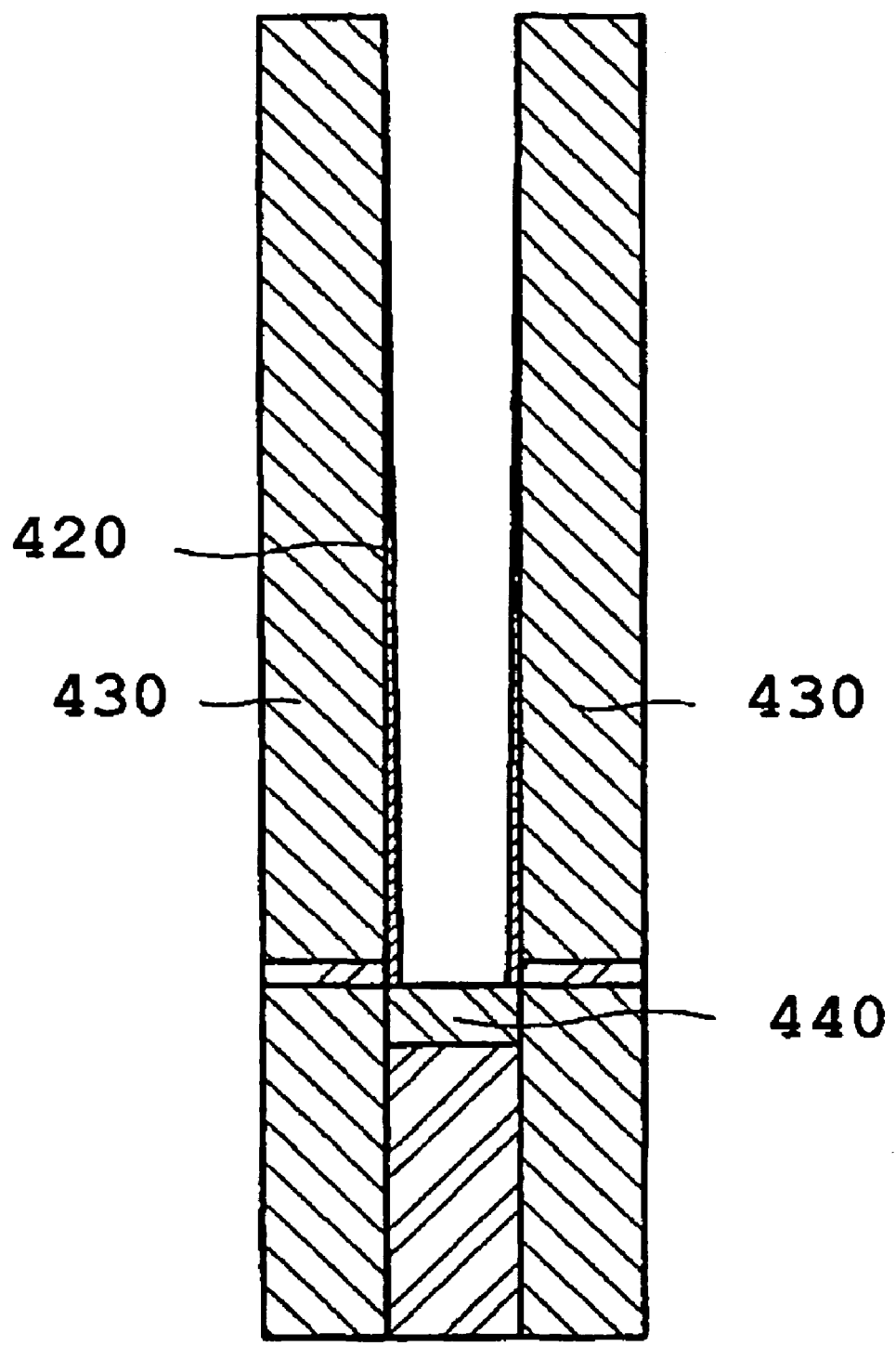

Next, as illustrated in FIG. 4B, portions of the buffer layer 420 can be removed from the upper and lower regions of the structure to provide the trench 410 with a buffer layer 420 along the sidewalls of the trench 410. The portions of the buffer layer 420 can be removed by dry etching the buffer layer 420 to form a spacer of buffer layer 420 as shown on the sidewalls of the trench 410. It is noted that the buffer layer 420 can be tapered from top to bottom along high aspect ratio sidewalls of the trench 410 as illustrated in FIG. 4B. By providing tapering, the buffer layer 420 can be provided with a reduced overall thickness within the trench, especially at an upper region of the trench 410, while still providing the desired buffer layer 420 attributes.

Figure 4C:
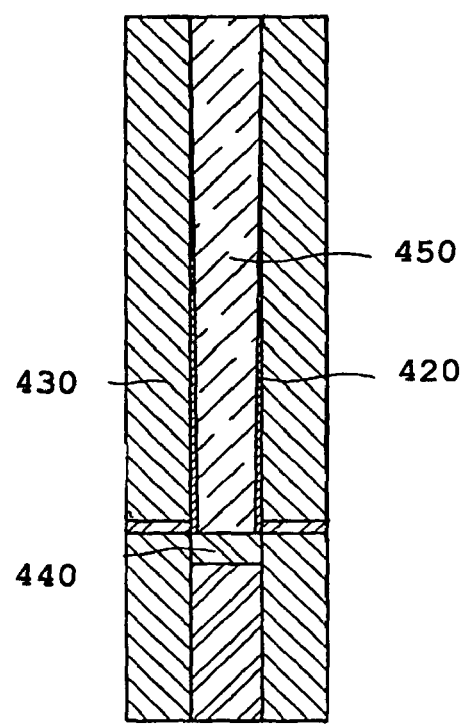

Next, as illustrated in FIG. 4C, the trench 410 with the buffer layer 420 spacer on the sidewalls can be filled with electrode material, which can be a platinum group metal, such as Ru, to form an inner electrode 450. As illustrated in FIG. 4C, the inner electrode 450 can be in contact with the barrier 440 and the sidewalls of the buffer layer 420 spacer.

Figure 4D:
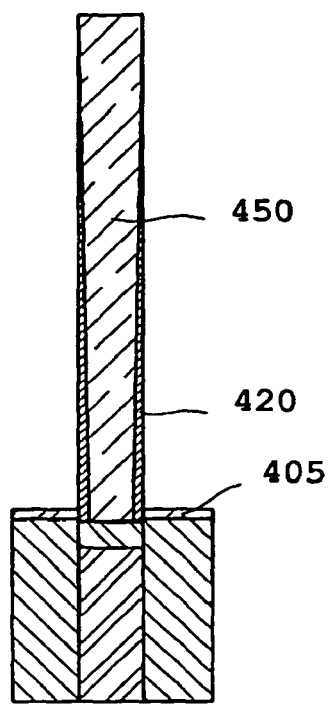

Next, as illustrated in FIG. 4D, portions of insulating material 430 surrounding the trench 410 can be removed to form a monolithic capacitor shape of a buffer layer 420 spacer with an inner electrode 450 therein. The removal of the $SiO_2$ can be accomplished through planarization and wet etch. For example, HCl and $H_2O_2$ or HF can be used to planarize and wet etch to remove the portions of the $SiO_2$ insulating material 430 on the side portions of the buffer layer 420.

Figure 4E:
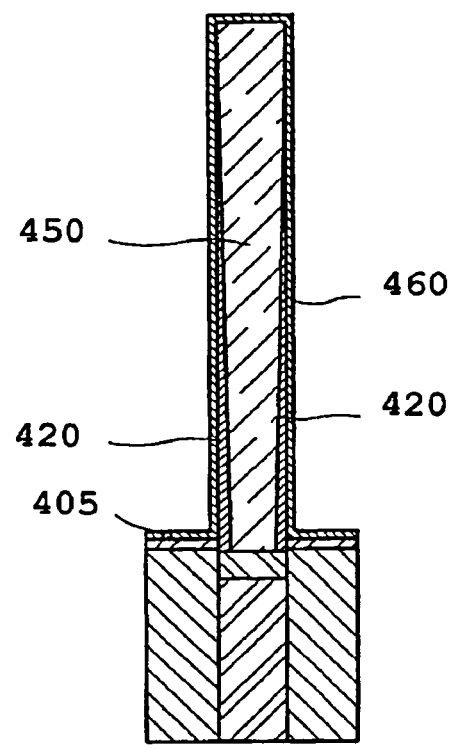

Next, as illustrated in FIG. 4E, the inner electrode 450 and the buffer layer 420 can be coated with a dielectric layer 460, which can be formed of $Ta_2O_5$ for example. As a result of this dielectric layer 460 coating, as illustrated in FIG. 4E, the dielectric layer 460 can create a linear sidewall region for the capacitor, wherein the dielectric layer 460 borders the buffer layer 420 on the lower portions and borders the Ru inner electrode on the upper portions. It is noted that while the dielectric layer 460 has a shape complementary to the shape of the buffer layer 420, the dielectric layer 460 and the buffer layer 420 can be formed of any shape, or size as desired.

Figure 4F:
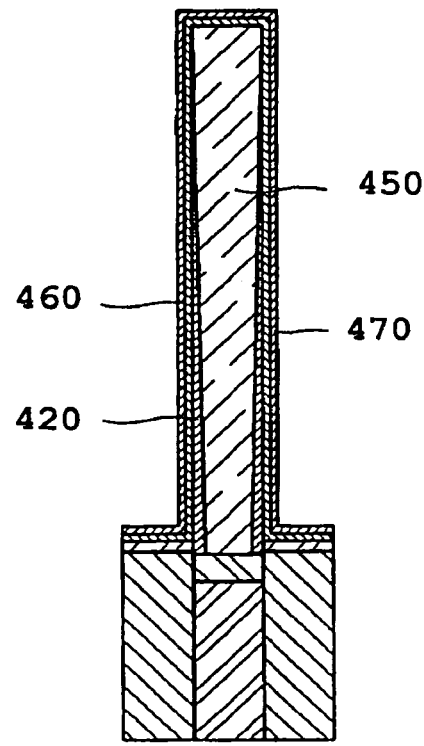

Finally, as illustrated in FIG. 4F, an outer electrode 470, which can also be a platinum group metal, such as Ru, can be formed on the dielectric layer 460 to complete the three-dimensional capacitor. By forming the outer electrode 470 on the combination of the buffer layer 420 and the dielectric layer 460, the processing temperature for the material between the inner electrode 450 and the outer electrode 470 can be lowered by using the buffer layer 420. As mentioned above, by lowering the processing temperature through the use of the buffer layer 420 in addition to the dielectric layer 460, the inner electrode 450 can be nucleated within the patterned $SiO_2$ high aspect ratio hole through the increased solubility of the Group V metal oxide into $SiO_2$ compared to the solubility of the electrode material (i.e., Ru) into $SiO_2$.

Figure 4G:
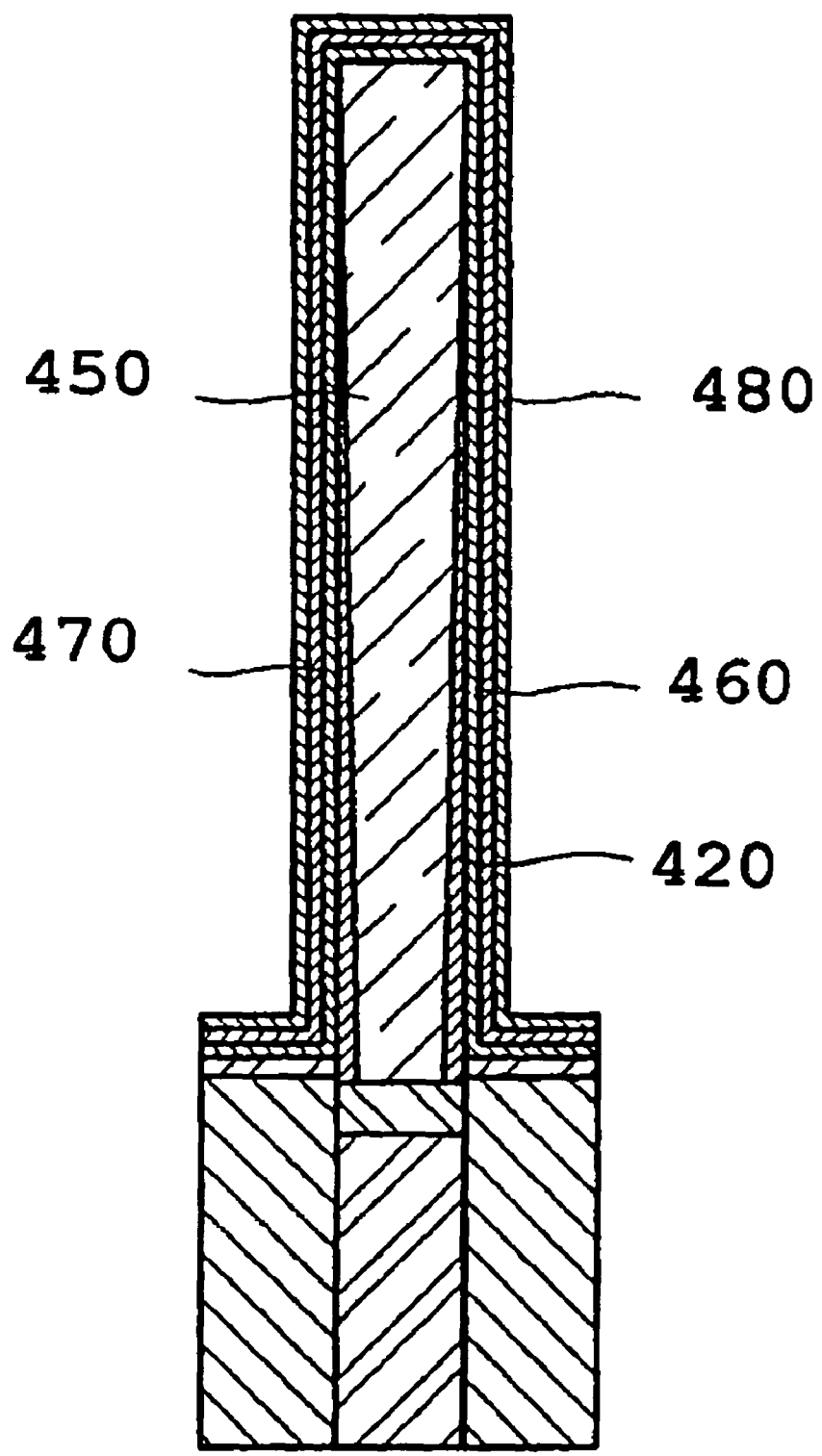

It is noted that, as illustrated in FIG. 4G, an optional protective layer 480, e.g., $Al_2O_3$, can also be provided on an outer region of the capacitor 400 to protect the capacitor 400 as desired.

Preferred embodiments have been disclosed herein and, although specific terms are employed, they are used in a generic and descriptive sense only and not for purpose of limitation. Accordingly, it will be understood by those of ordinary skill in the art that various changes in form and details may be made without departing from the spirit and scope as set forth in the following claims.

What is claimed is:

1. A three-dimensional capacitor, comprising:
   an inner electrode;
   a Group V metal oxide buffer layer on the inner electrode, wherein the buffer layer is tapered such that a thickness of the buffer layer varies gradually between a first edge of the inner electrode and a second edge of the inner electrode displaced laterally from the first edge of the inner electrode;
   a dielectric layer of tantalum oxide disposed on the buffer layer; and
   an outer electrode disposed on the dielectric layer.

2. The capacitor as claimed in claim 1, wherein the thickness of the buffer layer is a complementary thickness to the dielectric layer such that the thickness of the combination is substantially uniform from the upper portions to the lower portions of the buffer layer and the dielectric layer.

3. The capacitor as claimed in claim 2, wherein the Group V metal oxide buffer layer comprises an oxide of vanadium and/or niobium.

4. The capacitor as claimed in claim 2, wherein the dielectric layer is tapered complementarily to the tapering of the buffer layer.

5. The capacitor as claimed in claim 1, wherein the inner electrode comprises ruthenium, wherein the outer electrode comprises ruthenium, and/or wherein the dielectric layer comprises tantalum oxide.

6. The capacitor as claimed in claim 1, wherein a combination of the buffer layer and the dielectric layer have a lower crystallization temperature than a crystallization temperature of the dielectric layer alone.

7. The capacitor as claimed in claim 1, wherein the Group V metal oxide buffer layer comprises an oxide of vanadium and/or niobium.

8. The capacitor as claimed in claim 1, wherein the first and second edges of the inner electrode are transverse to mutually opposed outer edges of the inner electrode.

9. The capacitor as claimed in claim 1, wherein the buffer layer has a tapered thickness gradient extending between the first and second edges of the inner electrode.

10. The capacitor as claimed in claim 1, wherein the buffer layer has first and second edges disposed at locations substantially corresponding to the first and second edges of the inner electrode, and the buffer layer is tapered from the first edge of the buffer layer to the second edge of the buffer layer.

11. A memory device comprising:
    a substrate;
    a memory cell arranged on the substrate; and
    a three-dimensional capacitor,
    wherein the three-dimensional capacitor comprises:
       an inner electrode;
       a Group V metal oxide buffer layer on the inner electrode,
       wherein the buffer layer is tapered such that a thickness of the buffer layer varies gradually between a first edge of the inner electrode and a second edge of the inner electrode;
       a dielectric layer of tantalum oxide disposed on the buffer layer; and
       an outer electrode disposed on the dielectric layer.

12. The memory device as claimed in claim 11, wherein the thickness of the buffer layer is a complementary thickness to the dielectric layer such that the thickness of the combination of the buffer layer and the dielectric layer is substantially uniform from the upper portions to the lower portions of the buffer layer and the dielectric layer.

13. The memory device as claimed in claim 12, wherein the dielectric layer is tapered complementarily to the tapering of the buffer layer.

14. The memory device as claimed in claim 11, wherein the Group V metal oxide buffer layer comprises an oxide of vanadium and/or niobium.

15. The memory device as claimed in claim 11, wherein the inner electrode comprises ruthenium, wherein the outer electrode comprises ruthenium, and/or wherein the dielectric layer comprises tantalum oxide.

16. The memory device as claimed in claim 11 wherein a combination of the buffer layer and the dielectric layer have a lower crystallization temperature than a crystallization temperature of the dielectric layer alone.

17. The memory device as claimed in claim 11, wherein the memory device is a type of memory device selected from the group consisting of DRAM (dynamic random access memory), FRAM (Ferroelectric Random-Access Memory), DRO (destructive read out), NDRO (non-destructive read out) and RAM (random access memory).

18. The memory device as claimed in claim 11, wherein the first and second edges of the inner electrode are transverse to mutually opposed outer edges of the inner electrode, and the buffer layer is disposed on one of the outer edges of the inner electrode.

19. The memory device as claimed in claim 11, wherein the buffer layer has a tapered thickness gradient extending between the first and second edges of the inner electrode.

20. The memory device as claimed in claim 11, wherein the buffer layer has first and second edges disposed at locations substantially corresponding to the first and second edges of the inner electrode, and the buffer layer is tapered from the first edge of the buffer layer to the second edge of the buffer layer.

* * * * *